US011333622B2

(12) United States Patent
Marchais et al.

(10) Patent No.: US 11,333,622 B2
(45) Date of Patent: May 17, 2022

(54) THERMAL MODEL OF TRANSDUCER FOR THERMAL PROTECTION AND RESISTANCE ESTIMATION

(71) Applicant: Cirrus Logic International Semiconductor Ltd., Edinburgh (GB)

(72) Inventors: Emmanuel Marchais, Dripping Springs, TX (US); Carl Lennart Ståhl, Malmö (SE); Eric Lindemann, Boulder, CO (US); Jason W. Lawrence, Austin, TX (US); Dayong Zhou, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 158 days.

(21) Appl. No.: 16/842,482

(22) Filed: Apr. 7, 2020

(65) Prior Publication Data

US 2020/0348249 A1 Nov. 5, 2020

Related U.S. Application Data

(60) Provisional application No. 62/841,598, filed on May 1, 2019.

(51) Int. Cl.
| | |
|---|---|
| *H03G 11/00* | (2006.01) |
| *H04R 29/00* | (2006.01) |
| *G01N 25/18* | (2006.01) |
| *G01R 27/16* | (2006.01) |
| *H04R 3/00* | (2006.01) |
| *H04R 9/06* | (2006.01) |

(52) U.S. Cl.
CPC ............. *G01N 25/18* (2013.01); *G01R 27/16* (2013.01); *H04R 3/007* (2013.01); *H04R 9/06* (2013.01); *H04R 29/001* (2013.01); *H04R 2400/01* (2013.01); *H04R 2400/03* (2013.01)

(58) Field of Classification Search
CPC ........ G01N 25/18; G01R 27/16; H04R 3/007; H04R 9/06; H04R 29/001; H04R 2400/01; H04R 2400/03
USPC ..................................................... 381/55, 58
See application file for complete search history.

(56) References Cited

U.S. PATENT DOCUMENTS

| | | | | |
|---|---|---|---|---|
| 10,110,152 B1 * | 10/2018 | Hajati | ..................... | H03F 3/217 |
| 2002/0118841 A1 * | 8/2002 | Button | ................... | G01K 7/427 |
| | | | | 381/55 |
| 2017/0094408 A1 * | 3/2017 | Napoli | ................... | H04R 3/007 |

(Continued)

FOREIGN PATENT DOCUMENTS

| | | | |
|---|---|---|---|
| CN | 101394688 B | * | 5/2012 |
| EP | 2806656 A1 | | 11/2014 |
| WO | 0221879 A2 | | 3/2002 |

OTHER PUBLICATIONS

"Nonlinear Modeling of the Heat Transfer in Loudspeakers" by Wolfgang Klippel, Audio Eng. Soc., vol. 52, No. 1/2, Jan./Feb. 2004 (Year: 2004).*

(Continued)

*Primary Examiner* — Ammar T Hamid
(74) *Attorney, Agent, or Firm* — Jackon Walker L.L.P.

(57) ABSTRACT

A method for determining a direct current impedance of a transducer may include receiving an input signal indicative of an electrical power consumed by the transducer and calculating, by a thermal model of the transducer, the direct current impedance based on the electrical power.

26 Claims, 3 Drawing Sheets

(56) References Cited

U.S. PATENT DOCUMENTS

2019/0110145 A1    4/2019   Lawrence et al.
2021/0123626 A1*   4/2021   Zimmerman ........ G05B 13/041

OTHER PUBLICATIONS

"Nonlinear Modeling of the Heat Transfer in Loudspeakers" by Wolfgang Klippel. (Year: 2004).*

International Search Report and Written Opinion of the International Searching Authority, International Application No. PCT/US2020/027971, dated Sep. 4, 2020.

Klippel et al. , "Nonlinear Modeling of the Heat Transfer in Loudspeakers", JAES, AES, New York NY, Feb. 1, 2004, pp. 3-25.

* cited by examiner

THERMAL MODEL OF TRANSDUCER FOR THERMAL PROTECTION AND RESISTANCE ESTIMATION

RELATED APPLICATION

The present disclosure claims priority to U.S. Provisional Patent Application Ser. No. 62/841,598, filed May 1, 2019, which is incorporated by reference herein in its entirety.

FIELD OF DISCLOSURE

The present disclosure relates in general to estimating parameters of an electromagnetic load, for example, a haptic transducer.

BACKGROUND

Mobile platforms are continually demanding better performance from their transducers, such as louder audio and better sound quality from their sound systems and better haptics performance.

For haptic transducers and other transducers, it may be desirable to determine a precise estimated resistance of the transducer, for purposes of accounting for such resistance when generating a transducer driving signal, so as to improve dynamic operation and control of the transducer. For example, it may be desirable to apply negative impedance to a transducer driving signal, which may reduce an effective quality factor of the transducer, which may in turn minimize ringing occurring in the transducer after the transducer driving signal has ended. As another example, some control systems for haptic transducers may operate effectively when a precise estimate of direct-current resistance of the haptic transducer is available. For instance, a filter or controller may be used to regulate a back-electromotive force of a transducer, and such back-electromotive force may be estimated by subtracting a voltage drop across the estimated direct-current resistance a load voltage of the haptic transducer.

Further, transducers may be damaged when they are pushed to their limits. One common failure mode for overdriven transducers (e.g., speakers/haptics) is thermal damage. As an example, for speakers, if the voice coil exceeds a maximum temperature, the glues that hold the voice coil together and connect it to the diaphragm can melt and cause irreparable damage. As another example, at higher temperatures, magnets in a haptic transducer may become demagnetized and/or a coil of the haptic transducer may fuse, causing an electrical short. Speaker protection algorithms are commonly used to drive the speaker to its maximum volume while ensuring it does not exceed its rated limits, and similar protection algorithms may be used in connection with haptic transducers.

SUMMARY

In accordance with the teachings of the present disclosure, the disadvantages and problems associated with undesirable dynamics and thermal protection of an electromagnetic load may be reduced or eliminated.

In accordance with embodiments of the present disclosure, a method for determining a direct current impedance of a transducer may include receiving an input signal indicative of an electrical power consumed by the transducer and calculating, by a thermal model of the transducer, the direct current impedance based on the electrical power.

In accordance with these and other embodiments of the present disclosure, a system may include a transducer and a control system for monitoring operation of the transducer and configured to determine a direct current impedance of a transducer by receiving an input signal indicative of an electrical power consumed by the transducer, and calculating, by a thermal model of the transducer implemented by the control system, the direct current impedance based on the electrical power.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal will generally be an analog time varying voltage signal, for example, a time varying waveform.

Figure 1:
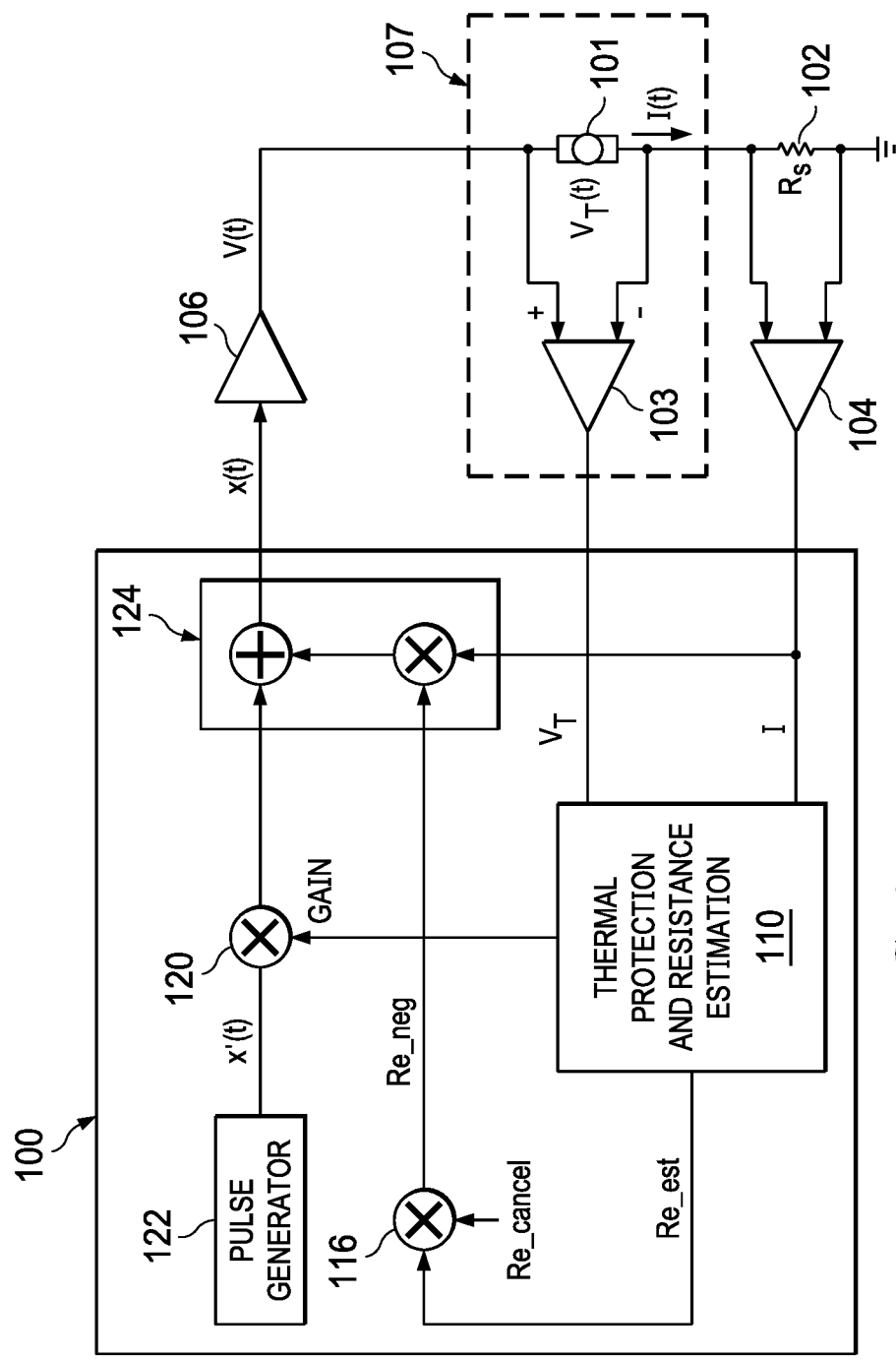
FIG. 1 illustrates an example control system for use with a transducer, in accordance with embodiments of the present disclosure.

FIG. 1 illustrates an example control system 100 for use with a transducer 101, in accordance with embodiments of the present disclosure. In some embodiments, system 100 may be integral to a host device comprising system 100 and haptic transducer 101. Such device may include, without limitation, a mobile device, home appliance, a vehicle, and/or any other system, device, or apparatus that includes a human-machine interface. As described in greater detail below, a system 100 may implement negative impedance block 124 to apply to the raw transducer driving signal, which may reduce an effective quality factor q of the transducer, which may in turn minimize ringing occurring after the raw transducer driving signal has ended.

Accordingly, one way system 100 may minimize quality factor q is to effectively decrease DC resistance Re of the transducer. In some embodiments, system 100 may ideally decrease the effective DC resistance Re to a point in which critical damping occurs in haptic transducer 101. To lower effective DC resistance Re, system 100 may, via negative impedance block 124, apply a negative impedance Re_neg in series with DC resistance Re. Negative impedance Re_neg may sum with resistance Re in series to produce a lower effective series resistance. As described in greater detail below, system 100 may implement negative impedance Re_neg as a feedback loop around haptic transducer 101.

For example, where a measure of a current I(t) and terminal voltage $V_T(t)$ resulting from applying a waveform signal x(t) through haptic transducer 101 is readily accessible, then system 100 may implement a negative feedback loop in the form of adding the mathematical product $Re \times R_{e\_cancel} \times I(t)$ to a raw waveform signal x'(t) at negative impedance block 124 to generate waveform signal x(t) for driving haptic transducer 101. Multiplicative factor $R_{e\_cancel}$ may be a value between 0 and 1 (e.g., 0.97) that sets a fraction of DC resistance Re to be cancelled at negative impedance block 124 (e.g., by multiplying an estimate of DC resistance Re ($R_{e\_est}$) by multiplicative factor $R_{e\_cancel}$ at multiplier 116). Resistance estimate $R_{e\_est}$ may be an estimate of true series resistance Re. As shown in FIG. 1, a thermal protection and resistance estimation block 110 may generate resistance estimate $R_{e\_est}$ as described in greater detail below. In addition, as described in greater detail below, thermal protection and resistance estimation block 110 may generate a gain GAIN that may be applied to raw waveform signal x'(t) (e.g., by multiplying raw waveform signal x'(t) by gain GAIN at multiplier 120).

In operation, a pulse generator 122 may generate raw waveform signal x'(t). Raw waveform signal x'(t) may comprise any suitable signal for driving haptic transducer 101 (e.g., having characteristics to generate a desired haptic effect at haptic transducer 101). For example, raw waveform signal x'(t) may have characteristics based on a resonant frequency, quality factor, and/or other parameter of haptic transducer 101. Multiplier 120 may apply gain GAIN to raw waveform signal x'(t) and negative impedance block 124 of system 100 may generate waveform signal x(t) from the gained raw waveform signal x'(t). Waveform signal x(t) may in turn be amplified by amplifier 106 to generate the driving signal V(t) for driving haptic transducer 101. Although FIG. 1 depicts haptic transducer 101, in some embodiments, another electromagnetic load (e.g., a loudspeaker, a microspeaker, a piezoelectric transducer) may be present in lieu of haptic transducer 101.

Responsive to driving signal V(t), a sensed terminal voltage $V_T(t)$ of haptic transducer 101 may be converted to a digital representation $V_T$ by a first analog-to-digital converter (ADC) 103. Similarly, sensed current I(t) may be converted to a digital representation I by a second ADC 104. Current I(t) may be sensed across a shunt resistor 102 having resistance $R_s$ coupled to a terminal of haptic transducer 101. The terminal voltage $V_T(t)$ may be sensed by a terminal voltage sensing block 107, for example a volt meter.

These real-time digital estimates of sensed terminal voltage $V_T(t)$ and sensed current I(t) may be made available to system 100, which may be implemented in whole or in part by a central processing unit, digital signal processor, or other digital circuit. System 100 may in turn perform thermal protection and resistance estimation for haptic transducer 101, as described in greater detail elsewhere in this disclosure.

Figure 2:
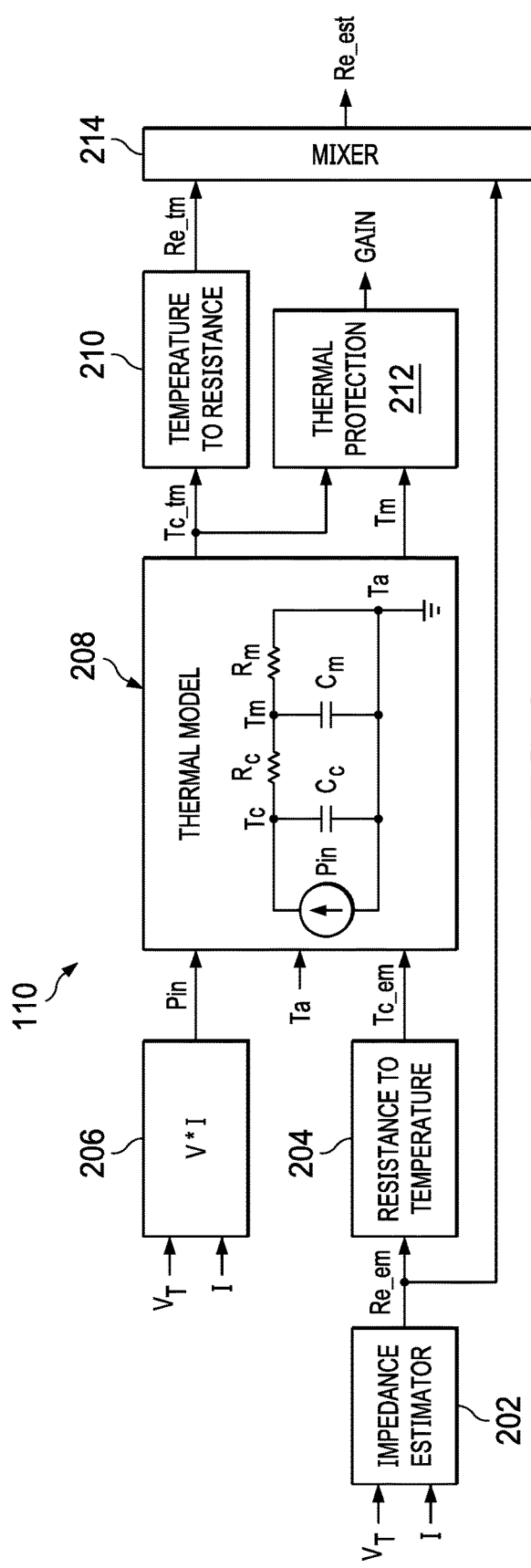
FIG. 2 illustrates an example thermal protection and resistance estimation block, in accordance with embodiments of the present disclosure.

FIG. 2 illustrates an example thermal protection and resistance estimation block 110, in accordance with embodiments of the present disclosure. As shown in FIG. 2, thermal protection and resistance estimation block 110 may include an impedance estimator 202, a resistance-to-temperature converter 204, an input power estimator 206, a thermal model 208, a temperature-to-resistance converter 210, a thermal protection subblock 212, and a mixer 214.

Impedance estimator 202 may comprise any suitable system, device, or apparatus configured to generate an electrically-measured series resistance Re_em for actual series resistance Re of haptic transducer 101. For example, in some embodiments, impedance estimator 202 may simply calculate electrically-measured series resistance Re_em as a quantity equal to an amplitude of terminal voltage $V_T$ divided by amplitude of current I. In other embodiments, impedance estimator 202 may more accurately estimate electrically-measured impedance by a least-squares fitting of a voltage and current sequence (e.g., having a sequence length between 5 and 100 milliseconds) to a series resistive and inductive impedance.

Resistance-to-temperature converter 204 may comprise any suitable system, device, or apparatus configured to calculate a measured coil temperature Tc_em of haptic transducer 101. For example, in some embodiments, resistance-to-temperature converter 204 may calculate measured coil temperature Tc_em by translating resistance to temperature based on a temperature coefficient of series resistance Re.

Input power estimator 206 may comprise any suitable system, device, or apparatus configured to calculate an estimated input power $P_{in}$ driven to haptic transducer 101. For example, in some embodiments, an input power estimator 206 may calculate estimated input power $P_{in}$ as the product of an amplitude of terminal voltage $V_T$ and an amplitude of current I. In other embodiments, input power estimator 206 may estimate power input in another manner, such as calculating estimated input power $P_{in}$ as the square of an amplitude of current I multiplied by electrically-measured series resistance Re_em or as the square of an amplitude terminal voltage $V_T$ divided by electrically-measured series resistance Re_em.

Thermal model 208 may comprise any suitable system, device, or apparatus configured to receive estimated input power $P_{in}$, which represents an amount of heat generated by haptic transducer 101 in response to driving signal V(t), and based thereon, calculate an estimated coil temperature Tc_tm and estimated magnetic temperature Tm. As shown in FIG. 2, thermal model 208 may include a modeled coil temperature Tc, modeled magnetic temperature Tm, and modeled ambient temperature Ta as state variables of the model, wherein such variables are modeled as voltage nodes of an equivalent circuit model as resistances and capacitances (e.g., representing thermal mass and other thermal parameters) driven by estimated input power $P_{in}$ modeled as a power source. For example, thermal parameters of a coil of haptic transducer 101 may be modeled as an equivalent resistance Re and capacitance Cc, and magnetic parameters of the load may be modeled as an equivalent resistance Rm and capacitance Cm. However, thermal model 208 may include a model different than that depicted in FIG. 2. For instance, in some embodiments, thermal model 208 may be modeled as a third-order or higher-order model as opposed to the second order model shown in FIG. 2.

As shown in FIG. 2, thermal model 208 may receive measured coil temperature Tc_em such that modeled coil temperature Tc may from time to time be updated with an actual measured temperature represented by measured coil temperature Tc_em in order to improve modeling accuracy. Also as shown in FIG. 2, thermal model 208 may receive an actual ambient temperature Ta such that modeled ambient temperature Ta may from time to time be updated with an actual ambient temperature Ta in order to improve modeling accuracy. In the event that an actual ambient temperature Ta is not provided, in some instances thermal model 208 may assume that modeled ambient temperature Ta is equal to modeled coil temperature Tc, as would be the case if haptic transducer 101 has not been in operation long enough to heat up from being driven by driving signal V(t). In other instances, thermal model 208 may assume that modeled ambient temperature Ta represents a nominal environmental temperature that does not require updating. In yet other instances, modeled ambient temperature Ta may be an output of thermal model 208.

In some embodiments, thermal model 208 may be implemented by or form an integral part of an infinite impulse response filter. On other embodiments, thermal model 208 may be implemented by or form an integral part of a Kalman filter.

Temperature-to-resistance converter 210 may comprise any suitable system, device, or apparatus configured to, based on estimated coil temperature Tc_tm, calculate a thermally-modeled series resistance Re_tm for actual series resistance Re of haptic transducer 101. For example, in some embodiments, temperature-to-resistance converter 210 may calculate thermally-modeled series resistance Re_tm by translating temperature to resistance based on a temperature coefficient of series resistance Re.

In some embodiments, resistance-to-temperature converter 204, thermal model 208, and temperature-to-resistance converter 210 may be combined into a single model that receives as inputs estimated input power $P_{in}$, electrically-measured series resistance Re_em, and an ambient-temperature resistance Ra that represents a resistance of the coil when it has settled to ambient temperature Ta. Such combined model may generate thermally-modeled series resistance Re_tm and a thermally-modeled magnetic resistance Rm_tm as outputs. In such combined model, state variables of thermal model 208 may represent the resistance values the coil and magnet would have when the coil and magnet temperatures reach estimated coil temperature Tc_tm and modeled magnetic temperature Tm, respectively. Such combined model may have the benefit that no temperature is estimated by the combined model, wherein such temperature estimation may otherwise require a calibration step to accurately map at least one resistance value to a temperature value and wherein a thermal protection circuit tests its inputs of thermally-modeled series resistance Re_tm and thermally-modeled magnetic resistance Rm_tm against worst-case resistance thresholds to decide on engaging thermal protection. The combined method may be less accurate than comparing to actual threshold temperatures but may be adequate for particular applications.

Inputs to and outputs from thermal model 208 may change over time as controlled by a sequencing state-machine, and such inputs and outputs may be adapted to best determine all the quantities modeled: modeled coil temperature Tc, modeled magnetic temperature Tm, and modeled ambient temperature Ta, based on availability of external information, including without limitation estimated input power $P_{in}$, measured coil temperature Tc_em, and externally-measured ambient temperature Ta_ext. It is noted that modeled ambient temperature Ta may be different than externally-measured ambient temperature Ta_ext (e.g., which may be determined by an external temperature sensor or some other means). When thermal model 208 receives estimated input power $P_{in}$ and measured coil temperature Tc_em as inputs, it may estimate and output modeled magnetic temperature Tm and/or estimated coil temperature Tc_tm (and also modeled ambient temperature Ta if modeled ambient temperature Ta is assumed non-constant). When thermal model 208 receives estimated input power $P_{in}$ and modeled ambient temperature Ta as inputs, it may estimate and output modeled magnetic temperature Tm and/or estimated coil temperature Tc_tm.

Thermal protection subblock 212 may comprise any suitable system, device, or apparatus configured to, based on one or more temperatures associated with haptic transducer 101 (e.g., estimated coil temperature Tc_tm and/or modeled magnetic temperature Tm) determine if such one or more temperatures exceed thermal limits for haptic transducer 101 and reduce gain GAIN if such one or more temperatures exceed thermal limits for haptic transducer 101. In some embodiments, thermal protection subblock 212 may use other approaches for reducing thermal power to haptic transducer 101 (e.g., request clipping to the output of amplifier 106).

Mixer 214 may comprise any suitable system, device, or apparatus configured to mix a selected portion of thermally-modeled series resistance Re_tm and a portion of electrically-measured series resistance Re_em to be mixed together to generate estimated DC resistance $R_{e\_est}$. In some embodiments, mixer 214 may operate as a multiplexer passing either thermally-modeled series resistance Re_tm or electrically-measured series resistance Re_em as estimated DC resistance $R_{e\_est}$.

Figure 3:
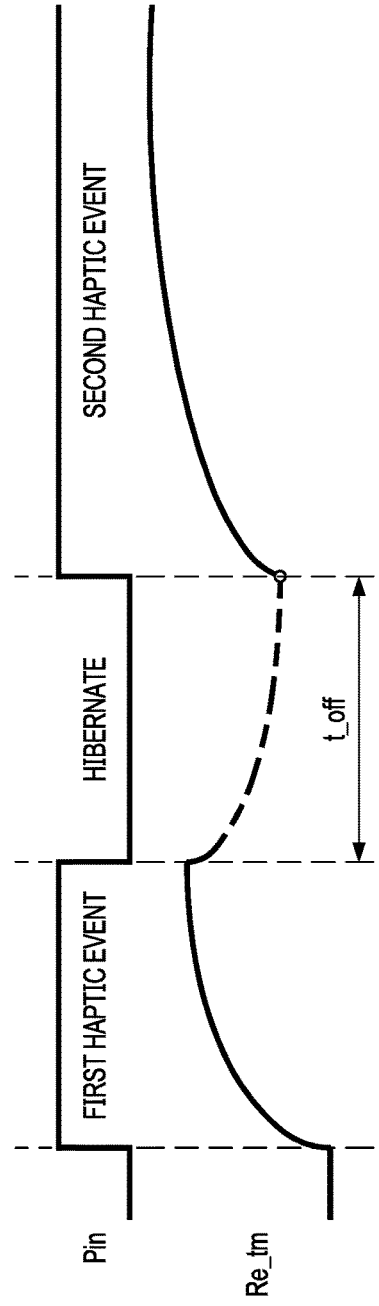
FIG. 3 illustrates example waveforms for estimated input power to a haptic transducer and thermally-modeled series resistance of the haptic transducer over a plurality of haptic events, in accordance with the present disclosure.

In operation, and as described in greater detail below, during a first haptic event (e.g., during an actual haptic event for providing haptic feedback to a user or a pilot tone generated by pulse generator 122 for characterizing estimated DC resistance $R_{e\_est}$), thermal protection and resistance estimation block 110 may determine estimated DC resistance $R_{e\_est}$ based on electrically-measured series resistance Re_em and set state variables for modeled coil temperature Tc, modeled magnetic temperature Tm, and/or modeled ambient temperature Ta of thermal model 208 based on measured coil temperature Tc_em converted from electrically-measured series resistance Re_em. For a later-occurring second haptic event, thermal protection and resistance estimation block 110 may determine estimated DC resistance $R_{e\_est}$ to be equal to thermally-modeled series resistance Re_tm calculated by thermal model 208 based on estimated input power $P_{in}$, thus permitting an estimate of DC resistance Re without generating a measurement by impedance estimator 202. To further illustrate this operation, FIG. 3 illustrates example waveforms for estimated input power $P_{in}$ and thermally-modeled series resistance Re_tm over a plurality of haptic events, in accordance with the present disclosure. As shown in FIG. 3, during a first haptic event, thermal model 208 may estimate thermal states (including modeled ambient temperature Ta) for the coil and magnet of haptic transducer 101 increasing modeled series resistance Re_tm in a transient fashion, which should track an actual increase in actual DC resistance Re. A hibernation period may occur after the first haptic event, in which actual DC resistance Re may decrease (and in which modeled series resistance Re_tm may decrease). At the start of the second haptic event, thermal model 208 may predict thermal states for the coil and magnet of haptic transducer 101 based on the last known states prior to hibernation and the duration between events (including an assumption that modeled ambient temperature Ta determined during the first haptic event remains constant during the hibernation period). For example, such thermal states may be predicted based on an estimate of transient electrical and/or thermal effects, such as an estimated decrease of modeled series resistance Re_tm in a transient fashion during the hibernation period. These states may be mapped to modeled series resistance Re_tm for the second haptic event and any subsequent haptic event unless and until an actual DC resistance Re may be determined.

Figure 4:
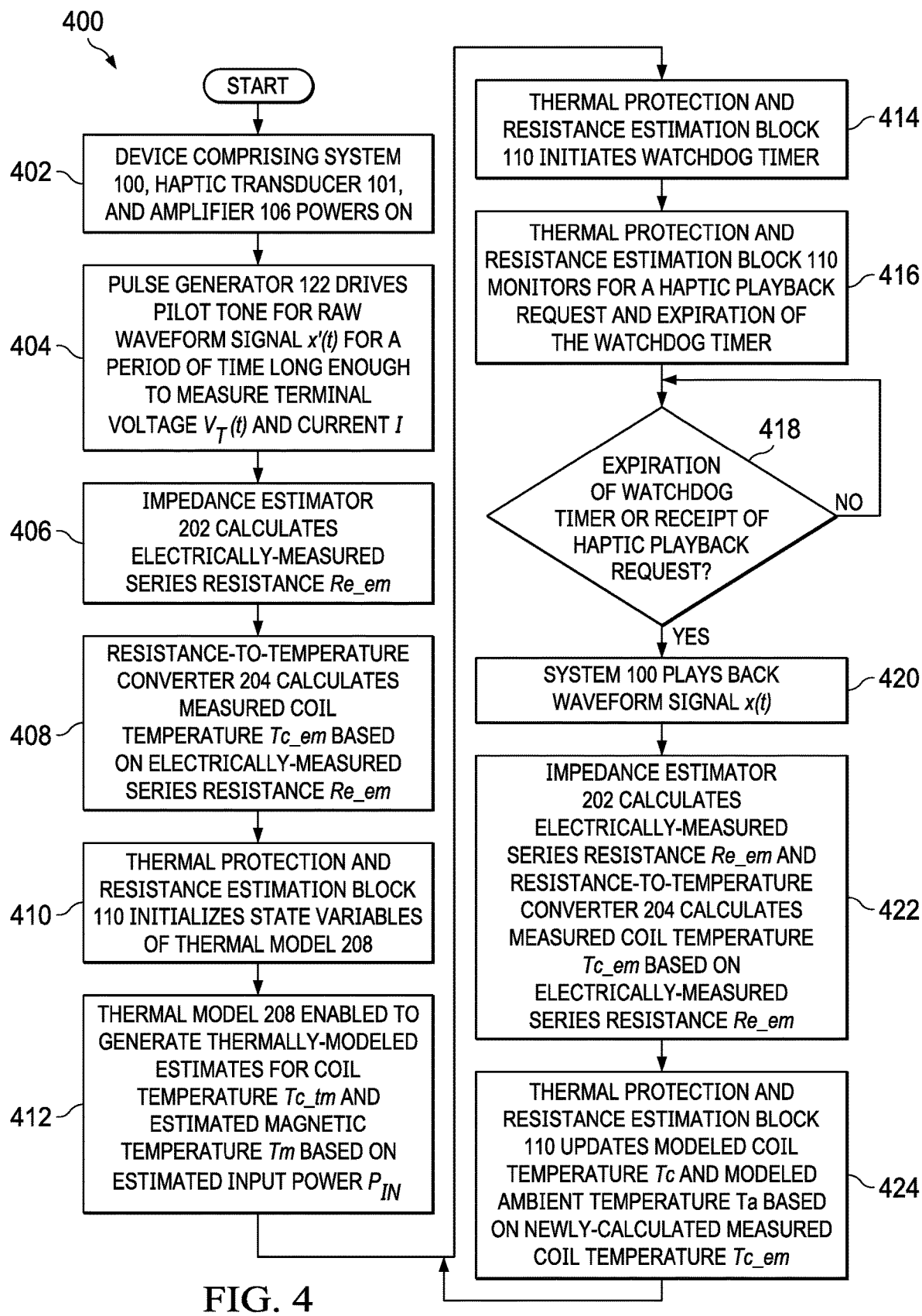
FIG. 4 illustrates a flowchart for an example method for thermal protection and resistance estimation, in accordance with embodiments of the present disclosure.

FIG. 4 illustrates a flowchart for an example method 400 for thermal protection and resistance estimation, in accordance with embodiments of the present disclosure. According to one embodiment, method 400 may begin at step 402. As noted above, teachings of the present disclosure may be implemented in a variety of configurations of system 100 and thermal protection and resistance estimation block 110. As such, the preferred initialization point for method 400 and the order of the steps comprising method 400 may depend on the implementation chosen.

At step 402, a device comprising system 100, haptic transducer 101, and amplifier 106 may power on. At step 404, pulse generator 122 may drive a pilot tone (e.g., at 10 Hz) for raw waveform signal x'(t) for a period of time long enough to measure terminal voltage $V_T(t)$ and current I.

At step 406, based on measured terminal voltage $V_T(t)$ and current I, impedance estimator 202 may calculate electrically-measured series resistance Re_em. At step 408, resistance-to-temperature converter 204 may calculate measured coil temperature Tc_em based on electrically-measured series resistance Re_em.

At step 410, thermal protection and resistance estimation block 110 may initialize state variables of thermal model 208. For example, modeled ambient temperature Ta may be set to a user setting, default setting, or other setting indicative of an ambient temperature for haptic transducer 101, modeled magnetic temperature Tm may be set to the modeled ambient temperature Ta, and modeled coil temperature Tc may be set to measured coil temperature Tc_em. At step 412, after state variables are initialized, thermal protection and resistance estimation block 110 may enable thermal model 208 to generate thermally-modeled estimates for coil temperature Tc_tm and estimated magnetic temperature Tm based on estimated input power $P_{in}$.

At step 414, thermal protection and resistance estimation block 110 may initiate a watchdog timer. At step 416, thermal protection and resistance estimation block 110 may monitor for a haptic playback request and expiration of the watchdog timer, and method 400 may proceed to step 418 upon occurrence of a haptic playback request or expiration of the watchdog timer. Accordingly, the watchdog timer may trigger estimation events for estimating DC resistance Re, and in such cases, a pilot tone below resonance frequency of haptic transducer 101 may be generated, wherein such pilot tone may not produce a user-perceptible haptic response. The generation of such pilot tone may assist in tracking variation of modeled ambient temperature Ta (e.g., predicted from electrically-measured series resistance Re_em and ambient-temperature resistance Ra when no external ambient temperature input (e.g. Ta_ext) is provided).

At step 418, responsive to expiration of the watchdog timer or the haptic playback request, temperature-to-resistance converter 210 may calculate thermally-modeled series resistance Re_tm based on estimated coil temperature Tc_tm generated from modeled coil temperature Tc, and thermal protection subblock 212 may determine a gain GAIN based on estimated coil temperature Tc_tm and/or modeled magnetic temperature Tm. Mixer 214 may pass thermally-modeled series resistance Re_tm as an estimated DC resistance $R_{e\_est}$, which may be used by negative impedance block 124 to apply a negative resistance to raw waveform signal x'(t).

At step 420, system 100 may play back waveform signal x(t) (e.g., either a pilot tone or haptic playback signal). At step 422, concurrent with the playback of waveform signal x(t), impedance estimator 202 may calculate electrically-measured series resistance Re_em and resistance-to-temperature converter 204 may calculate measured coil temperature Tc_em based on electrically-measured series resistance Re-_em. At step 424, thermal protection and resistance estimation block 110 may update modeled coil temperature Tc, modeled ambient temperature Ta, and/or other thermal parameters based on the newly-calculated measured coil temperature Tc_em. Until a subsequent haptic event (or a pilot tone triggered based on expiration of the watchdog timer) updates modeled ambient temperature Ta, modeled ambient temperature Ta may be assumed to remain constant. Thus, parameters of thermal model 208 may be estimated based on a time since the prior haptic event (which may be indicated by a status of the watchdog timer) based on principles of transient operation of electrical signals and temperatures. After completion of step 424, method 400 may proceed again to step 414.

Although FIG. 4 discloses a particular number of steps to be taken with respect to method 400, method 400 may be executed with greater or lesser steps than those depicted in FIG. 4. In addition, although FIG. 4 discloses a certain order of steps to be taken with respect to method 400, the steps comprising method 400 may be completed in any suitable order.

Method 400 may be implemented using system 100, thermal protection and resistance estimation block 110, or any other system operable to implement method 400. In certain embodiments, method 400 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

What is claimed is:

1. A method for determining a direct current impedance of a transducer, comprising:
   in response to a driving signal applied to the transducer:
   estimating an electrically-measured direct current impedance based on an electrical model of the transducer;
   estimating an electrically-measured coil temperature based on the electrically-measured direct current impedance; and
   setting one or more state variables of the thermal model based on the electrically-measured coil temperature;
   receiving an input signal indicative of an electrical power consumed by the transducer; and
   calculating, by a thermal model of the transducer, the direct current impedance based on the electrical power.

2. The method of claim 1, wherein calculating the direct current impedance comprises:
   generating, by the thermal model of the transducer, a coil temperature associated with the transducer; and
   calculating the direct current impedance based on the coil temperature.

3. The method of claim 1, wherein calculating the direct current impedance comprises calculating the direct current impedance directly from the electrical power, without an intermediate calculation of a coil temperature associated with the transducer.

4. The method of claim 1, further comprising mixing the direct current impedance with an estimated impedance value derived from an electrical model of the direct current impedance.

5. The method of claim 1, further comprising controlling a load power delivered to the transducer based on at least one of the coil temperature and another temperature generated by the thermal model.

6. The method of claim 5, wherein controlling the load power comprises determining a gain to be applied to the driving signal for driving the transducer based on at least one of the coil temperature and another temperature generated by the thermal model.

7. The method of claim 5, wherein controlling the load power comprises clipping to the driving signal for driving the transducer.

8. The method of claim 1, wherein the thermal model is implemented with a Kalman filter.

9. The method of claim 1, wherein the thermal model is implemented with an infinite impulse response filter.

10. The method of claim 1, wherein the transducer is a haptic transducer.

11. The method of claim 1, wherein the transducer is an audio speaker.

12. The method of claim 1, further comprising in the absence of the driving signal including a haptic event, driving a pilot tone to the transducer at regular intervals to set an ambient temperature as one of the one or more state variables.

13. The method of claim 1, further comprising:
   halting updates to the one or more state variables between haptic events within the driving signal; and
   prior to driving the transducer with the driving signal comprising a haptic event, updating the one or more state variables based on a time elapsed since a previous haptic event.

14. A system comprising:
   an input for receiving an input signal indicative of an electrical power consumed by the transducer; and
   a control system for monitoring operation of the transducer and configured to determine a direct current impedance of a transducer by:
   estimating an electrically-measured direct current impedance based on an electrical model of the transducer;
   estimating an electrically-measured coil temperature based on the electrically-measured direct current impedance;
   setting one or more state variables of the thermal model based on the electrically-measured coil temperature; and
   calculating, by a thermal model of the transducer implemented by the control system, the direct current impedance based on the electrical power.

15. The system of claim 14, wherein calculating the direct current impedance comprises:

generating, by the thermal model of the transducer, a coil temperature associated with the transducer; and calculating the direct current impedance based on the coil temperature.

16. The system of claim 14, wherein calculating the direct current impedance comprises calculating the direct current impedance directly from the electrical power, without an intermediate calculation of a coil temperature associated with the transducer.

17. The system of claim 14, wherein the thermal model is configured to mix the direct current impedance with an estimated impedance value derived from an electrical model of the direct current impedance.

18. The system of claim 14, wherein the control system is further configured to control a load power delivered to the transducer based on at least one of the coil temperature and another temperature generated by the thermal model.

19. The system of claim 18, wherein controlling the load power comprises determining a gain to be applied to a driving signal for driving the transducer based on at least one of the coil temperature and another temperature generated by the thermal model.

20. The system of claim 18, wherein controlling the load power comprises clipping to a driving signal for driving the transducer.

21. The system of claim 14, wherein the thermal model is implemented with a Kalman filter.

22. The system of claim 14, wherein the thermal model is implemented with an infinite impulse response filter.

23. The system of claim 14, wherein the transducer is a haptic transducer.

24. The system of claim 14, wherein the transducer is an audio speaker.

25. The system of claim 14, wherein the control system is further configured to, in the absence of the driving signal including a haptic event, cause a driver to drive a pilot tone to the transducer at regular intervals to set an ambient temperature as one of the one or more state variables.

26. The system of claim 14, wherein the control system is further configured to:

halt updates to the one or more state variables between haptic events within the driving signal; and prior to driving the transducer with the driving signal comprising a haptic event, update the one or more state variables based on a time elapsed since a previous haptic event.

* * * * *

UNITED STATES PATENT AND TRADEMARK OFFICE
CERTIFICATE OF CORRECTION

PATENT NO. : 11,333,622 B2
APPLICATION NO. : 16/842482
DATED : May 17, 2022
INVENTOR(S) : Marchais et al.

It is certified that error appears in the above-identified patent and that said Letters Patent is hereby corrected as shown below:

In the Claims

1. In Column 10, Line 26, in Claim 7, delete "to the" and insert -- the --, therefor.

2. In Column 10, Line 50, in Claim 14, delete "the transducer;" and insert -- a transducer; --, therefor.

3. In Column 10, Line 53, in Claim 14, delete "a transducer" and insert -- the transducer --, therefor.

4. In Column 12, Line 11, in Claim 25, delete "the driving signal" and insert -- a driving signal --, therefor.

5. In Column 12, Line 18, in Claim 26, delete "the driving signal;" and insert -- a driving signal; --, therefor.

Signed and Sealed this
Fifth Day of September, 2023

Katherine Kelly Vidal
*Director of the United States Patent and Trademark Office*